United States Patent [19]

Billman et al.

[11] Patent Number: 4,726,777

[45] Date of Patent: Feb. 23, 1988

[54] SOCKET FOR ZIG-ZAG INLINE PACKAGE

[75] Inventors: Timothy B. Billman, King; Joseph R. Goodman, Walkertown; Gary R. Marpoe, Jr., Winston-Salem, all of N.C.

[73] Assignee: AMP Incorporated, Harrisburg, Pa.

[21] Appl. No.: 46,335

[22] Filed: May 5, 1987

Related U.S. Application Data

[63] Continuation-in-part of Ser. No. 872,740, Jun. 10, 1986.

[51] Int. Cl.$^4$ .......................................... H01R 23/72
[52] U.S. Cl. ........................................ 439/70; 29/842
[58] Field of Search ............................. 439/70-73, 439/525, 526, 620, 682, 687-691, 712, 715, 717, 724, 842, 858, 861, 259-265, 296, 660, 686; 29/842-845

[56] References Cited

U.S. PATENT DOCUMENTS

| 848,505 | 3/1907 | Steinberger | 439/717 |
|---|---|---|---|
| 2,855,579 | 10/1958 | Wintriss | 439/381 |
| 3,639,888 | 2/1972 | Pittman et al. | 439/260 |
| 3,706,954 | 12/1972 | Krafthefer | 439/682 |
| 3,880,493 | 4/1975 | Lockhart, Jr. | 439/525 |
| 3,989,336 | 11/1976 | Rizzio, Jr. et al. | 439/260 |
| 4,060,296 | 11/1977 | Kunkle et al. | 439/70 |
| 4,349,238 | 9/1982 | Showman et al. | 439/264 |
| 4,356,532 | 10/1982 | Donaher et al. | 361/393 |
| 4,377,319 | 5/1983 | MacDougall | 439/264 |
| 4,418,475 | 12/1983 | Ammon et al. | 29/842 |
| 4,418,974 | 12/1983 | MacDougall | 439/368 |
| 4,428,633 | 1/1984 | Lundergan et al. | 439/70 |
| 4,487,464 | 12/1984 | Kirschenbaum | 439/660 |
| 4,541,034 | 9/1985 | Fanning | 361/405 |
| 4,606,599 | 8/1986 | Grant et al. | 439/857 |

FOREIGN PATENT DOCUMENTS 58188184 5/1985 Japan .

OTHER PUBLICATIONS

Connection Technology, advertisement, Nov. 1986, p. 62.

Primary Examiner—Gil Weidenfeld
Assistant Examiner—Gary F. Paumen
Attorney, Agent, or Firm—Eric J. Groen

[57] ABSTRACT

A connector for interconnecting a zig-zag inline package to a printed circuit board has a plurality of contacts in two parallel and offset rows. The contacts and housing are dimensionally controlled to be preloaded only when installed in the housing cavity, providing predictable preload and resultant insertion force. The connector also includes a decoupling capacitor, integral with the contacts which contact the power and ground lead of the integrated circuit packages.

10 Claims, 12 Drawing Figures

SOCKET FOR ZIG-ZAG INLINE PACKAGE

This is a Continuation-In-Part of U.S. patent application Ser. No. 872,740 filed June 10, 1986.

BACKGROUND OF THE INVENTION

1. Field of the Invention

The instant invention relates to a socket for mounting to a printed circuit board and for interconnecting the leads of an integrated circuit in the configuration of a zig-zag inline package to the traces on the printed circuit board.

2. Description of the Prior Art

There is disclosed in U.S. Pat. No. 4,060,296 a carrier for interconnecting thereto a dual inline package integrated circuit. The disclosure of the above-referenced U.S. patent shows dual leaf contacts mounted within a carrier cavity. Dual leaf refers to the mating configuration between the contact leaves and the package lead, in that there is metal-to-metal contact between the package lead and the socket contact on both sides of the package lead.

The dual inline package carrier, as disclosed in U.S. Pat. No. 4,060,296, however, was designed for DIP packages having leads with lateral spacing on 0.100 inch centerlines, and 0.300 inch width between the two rows of parallel and opposed leads. Furthermore, a DIP package consists of package leads extending outwardly from sidewalls of the package, then bending downwardly. As the radius in the lead is proximate the package body, the DIP lead can handle at least 500 grams of insertion force before overstressing the DIP leads.

In the increasing need to preserve printed circuit board real estate, manufacturers of integrated circuit packages have introduced a new configuration known as the zig-zag inline package. The zig-zag inline package body is similar in design to that of the dual inline package, the major difference lies in the lead configuration. The zig-zag inline package leads extend from one side of the package only, every other lead being bent away from the axial centerline in the opposite direction forming two axial rows of leads. The leads on the zig-zag inline package in the same axial row have 0.100 inch centerlines, each lead being laterally offset 0.050 inch from the next offset lead. The distance between axial rows is now 0.100 inch, as opposed to 0.300 inch on the dual inline package. The leads on the zig-zag inline package extend downwardly from the package, are then formed by a first radius projecting the lead outward away from the axial centerline of the package, and then by a second radius bending the lead back towards the axial centerline until the leads are again extending downwardly. The leads of the zig-zag inline package are extremely sensitive to overstress at the first and second radius, overstressing at approximately 270 grams insertion force.

The socket configuration disclosed in U.S. Pat. No. 4,060,296 could not be utilized for the zig-zag inline package. The disclosure of the above-mentioned patent relates to the interconnections for square matrix packages whereas the zig-zag inline package has an offset configuration. Furthermore, as the socket contacts are laterally opposed, the distance between axial rows of contacts was 0.300 inch, and could not be reduced to 0.100 inch with the contact directly opposed. The contacts as disclosed in the above-mentioned patents could not be utilized for the zig-zag inline package, as the insertion force on those contacts were not predictable enough to consistently maintain below a 270 gram insertion force. The contacts disclosed in U.S. Pat. No. 4,060,296 were formed with the two leaves in contact in a preloaded configuration. As the insertion force is directly related to the contact leaf preload, and as the contact leaf preload cannot be consistently held, the insertion force could not be held consistently either.

In order to provide enough current to multiple integrated circuit packages requiring current simultaneously, and to protect the integrated circuit packages from voltage spikes during the integrated circuit's refresh cycle, printed circuit boards typically contain a decoupling capacitor mounted to the board, decoupling the package from the power source. The printed circuit board mounted capacitor, however, further reduces the board space available for integrated circuits as the capacitor requires physical space for the capacitor and printed traces connected to the integrated circuit package leads. If the decoupling capacitors were remotely mounted from the printed circuit board, the printed circuit board would thereby be freed up for mounting integrated circuit packages providing for a higher density system.

SUMMARY OF THE INVENTION

It is an object of the present invention to provide an electrical connector for interconnecting leads of a zig-zag inline package to a printed circuit board.

It is a further object of the invention to provide an electrical connector for zig-zag inline packages with electrical contacts having a predictable preload thereby producing a predictable insertion force on said integrated circuit package leads.

It is a further object to design an electrical connector with means preventing the leads of said integrated circuit package from being over inserted, thereby damaging the leads.

It is a further object to design an electrical connector having the capability of end-to-end stackability with the lateral centerline spacing of adjacent sockets equal to the lateral centerline spacing of contacts in the same socket.

It is a further object of the instant invention to provide a means to decouple the integrated circuit package from the power source.

Other objects will be apparent from the following detailed description.

The first objective is accomplished by providing a housing with a plurality of contact receiving cavities in parallel but offset rows, and contact disposed in the cavities providing contact portions to both the integrated circuit package lead and the printed circuit board.

The second objective is accomplished by stamping and forming the electrical contacts such that no preload exists in the integrated circuit package lead contacting portion. The housing is characterized by an insulative housing having a central rib extending down the central portion of the housing, with two parallel and opposed rows of cavities on opposite sides of the central rib. The cavities are axially offset to accommodate the staggered package leads on the zig-zag inline package. Each cavity includes a rear surface which is beveled outwardly and a front surface as part of the central rib which is beveled inwardly towards the axial centerline of the housing.

The terminals include first contact portions which lie adjacent to the rear surface and extend downwardly into a first reversely bent portion to lie adjacent to a floor of the housing. The first reversely bent portion projects a leg upwardly adjacent to the forward surface and into a second reversely bent portion. A diagonal portion is thereafter projected inside of, and in a contacting relationship with, the first contacting portion.

The preload between the first and second contacting portions is controlled by stamping and forming the terminal such that a gap exists between the first and second contacting portions, so that no preload exists therebetween, when the terminal is in an unloaded condition, outside of the housing. The terminal is also controlled such that the outside distance between the leg and the second contact portion is a relatively fixed dimension. The distance between the front and rear surfaces is also a fixed dimension, but the dimension is less than the sum of the distance between the leg and the contact portion and the thickness of the first contacting portion.

When the terminal is inserted in the housing, the leg always contacts the corner between the front surface and the beveled surface, thus the leg and second contacting portion always deflect to a known distance. Said differently, the sum of the distance between the leg and second contacting portion, plus the thickness of the first contacting portion, equals the distance between the front and rear surfaces. This is due to the fact that the leg always contacts the corner.

The third objective is accomplished by providing standoffs projecting from the package receiving face integral with the housing, to accurately locate the package leads within the contacts and prevent further insertion.

The fourth objective is accomplished by abutting the end cavities of adjacent cavities in adjacent sockets to keep the centerline spacing of adjacent cavities equal to the lateral spacing between adjacent cavities in the same socket.

The fifth objective is accomplished by providing a decoupling capacitor mounted to and electrically connected to the contacts with contact the power and ground leads of the integrated circuit package.

BRIEF DESCRIPTION OF THE DRAWINGS

FIG. 8 is a perspective view of the decoupling capacitor of the instant invention.

DETAILED DESCRIPTION OF THE PREFERRED EMBODIMENT

Figure 1:
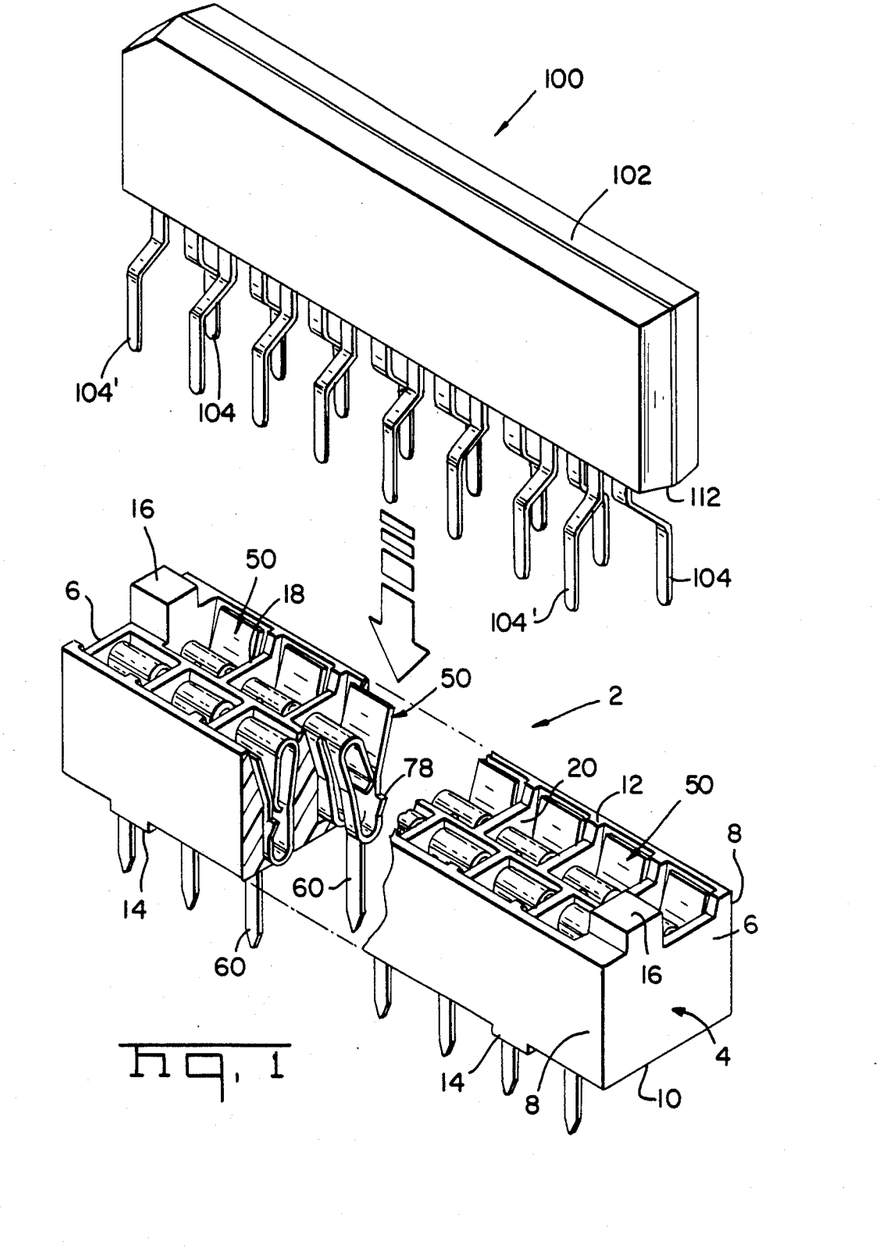
FIG. 1 is a perspective view of the socket of the instant invention showing the socket partially broken away, and the zig-zag inline package exploded away from the socket.

Referring now to FIG. 1, there is shown the socket 2 poised for receiving a zig-zag inline package 100. The socket 2 comprises a socket housing 4 and a plurality of contacts 50 mounted therein.

Figure 7:
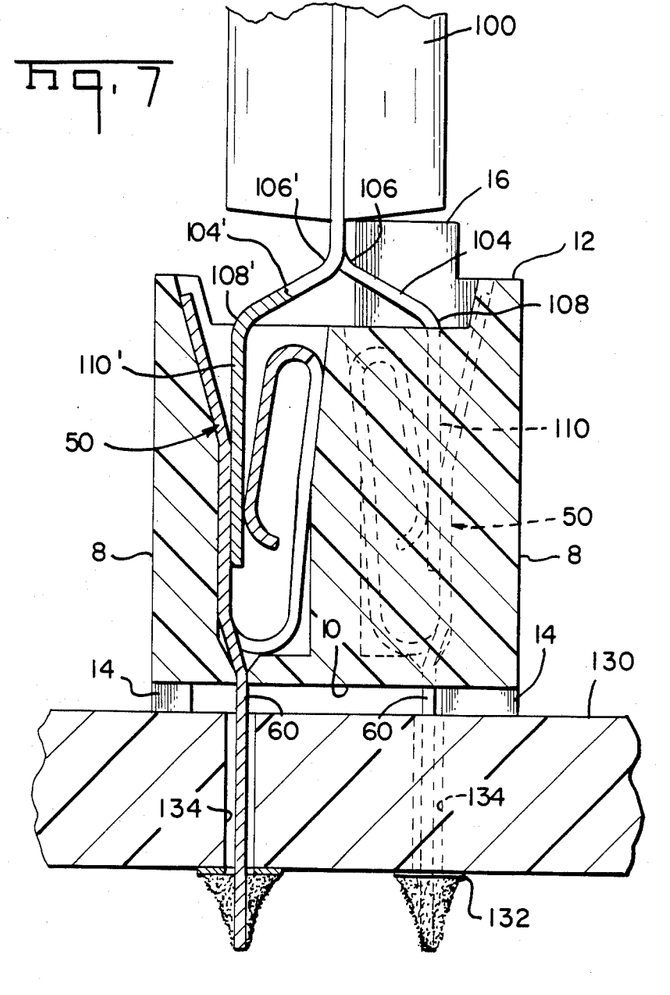
FIG. 7 is a view similar to that of FIG. 3 showing the socket mounted to a printed circuit board and a zig-zag inline package installed in the carrier assembly.

Also shown in FIG. 1 is a zig-zag inline package 100 having a body 102 and leads 104, 104'. The leads 104, 104' all exit the package body 102 along a common axial centerline. As shown in FIG. 7, the package leads 104 extends downwardly and are thereafter bent outwardly away from the common axial centerline at radius 106. The leads then project outwardly to a second radius 108 where the leads are bent back towards the axial centerline and extend downwardly as straight section 110. Lead 104' is bent in the same fashion as lead 104 at first and second radius 106', 108', but in the opposite direction in relation to the axial centerline. A typical zig-zag inline package which is commercially available is the Mitsubishi 256K DRAM, number MJM4256L-12.

Figure 2:
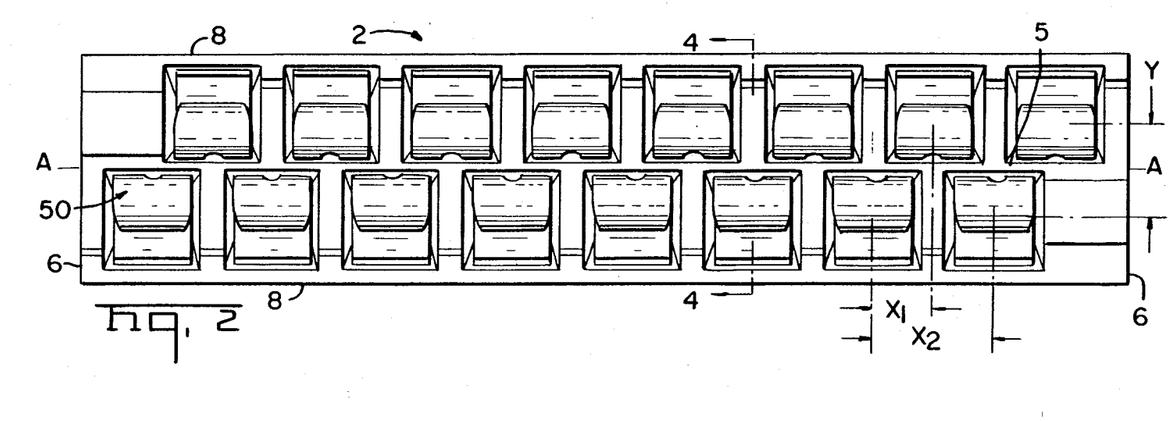
FIG. 2 is a top plan view of the socket of the instant invention.

Referring now to FIG. 2, the socket 2 is shown in a top plan view, where the axial direction will be referred to along lines A—A. The socket housing 2 includes a first and second row of contacts 50, the first row being laterally offset from the second row along the axial centerline, the first and second row of contacts 50 being spaced as the package leads 104, 104'. A central rib 5 is integral with the molded housing 2 and extends along the axial centerline of the housing, the two parallel rows of cavities being on opposite sides of the central rib 5. The distance Y attainable between axial centerlines of opposed rows of contacts, in the preferred embodiment is 0.100 inch. The lateral offset between the two rows, $X_1$, is 0.050 inches and the lateral spacing between contacts in the same row, $X_2$, is also 0.100 inches.

Referring again to FIG. 1, the socket is shown as having a housing 4 including endwalls 6, sidewalls 8, a bottom wall 10, and a package receiving face 12. Extending from the bottom wall 10 are lower standoffs 14, and extending upwardly from the contact receiving face 12 are upper standoffs 16. The socket housing 4 further comprises a plurality of contact receiving cavities 20.

Figure 6:
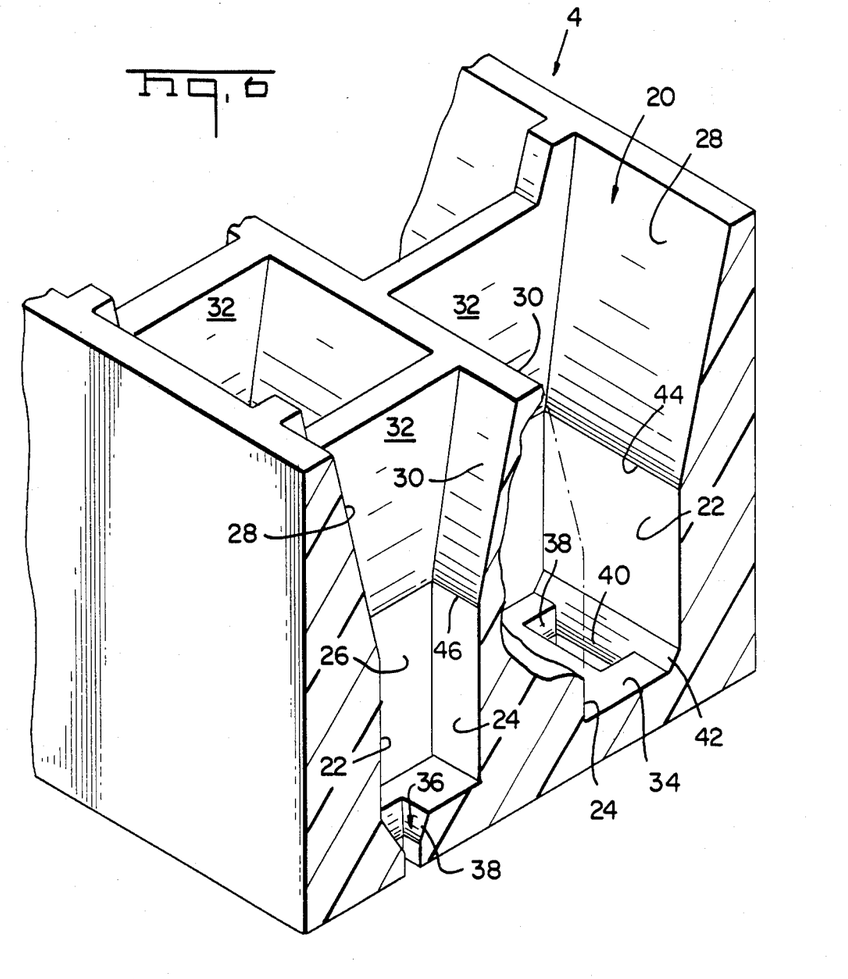
FIG. 6 is an isometric view of the housing partially cutaway to observe the inner particulars of the cavities.

Referring now to FIG. 6, the cavities 20 are shown in greater detail, as including a floor 34, outer sidewalls 22, inner sidewalls 24, and endwalls 26. The contact lead-in portion of cavity 20 is defined by outer beveled surfaces 28, inner beveled surfaces 30, and end beveled surfaces 32. The intersection of outer sidewalls 22 and outer beveled surfaces 28 form corners 44, whereas the intersection of inner sidewalls 24 and inner beveled surfaces 30 form corners 46. At the bottom of the cavity 20 and extending through the floor 34 are apertures 36 having lead-in surfaces 38, 40 therearound. It should be noticed that a lead-in surface 42 is located between the outer sidewalls 22 and the floor 34, and is continuous with lead-in surface 40.

Figure 3:
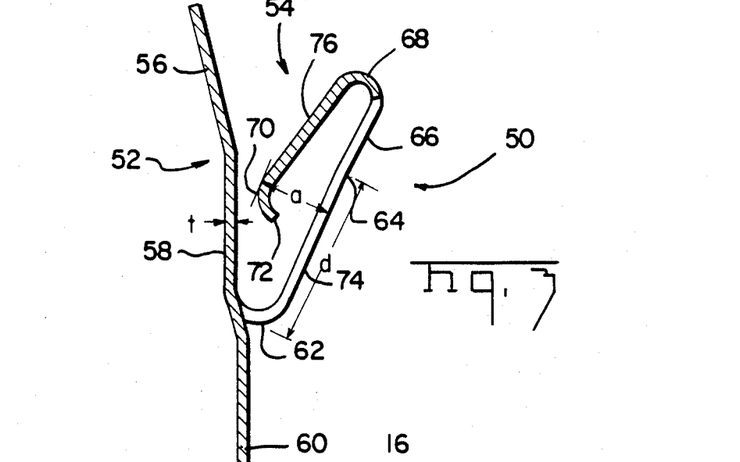
FIG. 3 is a side view of the terminal in the free state.

Referring now to FIG. 3, the contact 50 is shown in the free state as it exists after the forming operations. Contact 50 generally includes a first and second leaf section 52, 54, respectively and a printed circuit board lead section 60.

Contact 50 is stamped and formed from flat metal stock. The first leaf section comprises a lead-in section 56 and a straight section 58, the straight section 58 defining a first contacting portion. The printed circuit board contact 60 is stamped from the central portion of the contact 50, and is then bent downwardly, as best shown in FIGS. 1 and 3. Second leaf portion 54 begins with the remaining portion of the stamping being bent at a first radius 62 which reversely bends the terminal projecting the stamping upwardly in the same direction as the first leaf portion 52, along a straight leg portion 74. The stamping has a portion 66 bent away from the straight portion 74, about a corner 64. The stamping is then again formed about a second radius 68, reversely bending the terminal again which projects the contact portion 70 inwardly towards the first leaf portion 52. It should be noted from FIG. 3 that the first reversely bent portion 62 is of a larger radius of curvature than that of the second reversely bent portion 68. It will also be noticed from FIG. 3 that when the contact is not inserted in the cavity 20, the free state of the contact 50 is such that the first and second leaf portions 52 and 54, respectively, do not contact each other, as will be explained later, the insertion into the cavity preloads the first and second contact portions 58, 70 to a predetermined preload. It should be noted at this point that the preload between the two contacting portions must be kept between a range of approximately 200-270 grams such that insertion of the package leads themselves does not overstress the leads.

Figure 4:
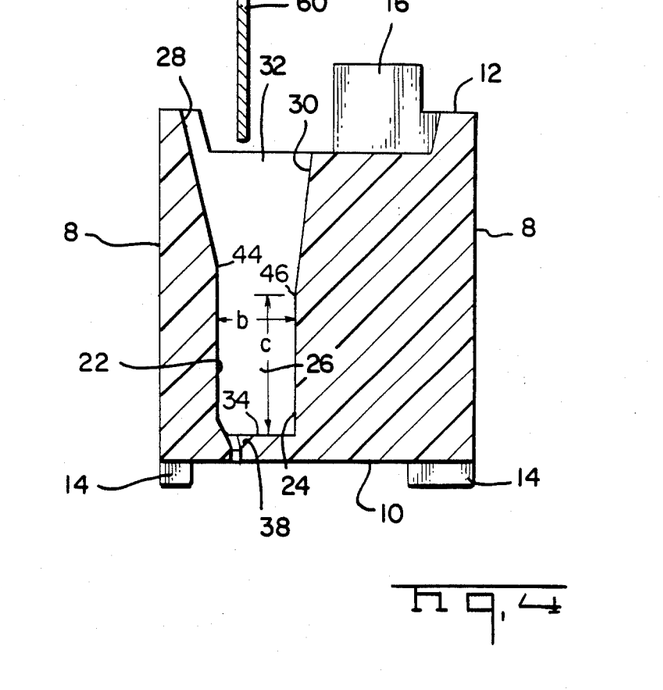
FIG. 4 is a cross section through lines 4—4 of FIG. 2, minus the terminals.

Several dimensions are accurately held so as to consistently hold the preload between the first 58 and second 70 contacting portions within a narrow range. First, the first 62 and second radius 68, and corner 64 are accurately dimensioned to provide an unbiased relationship between the first and second leaves with the contact portion 70 positioned accurately away from the first leaf portion 52. Secondly, the outside dimension between the leg 74 and the second contacting portion 70, shown as "a" in FIG. 3, is held to a fixed distance. The distance between the inner 24 and the outer 22 surfaces are also held to a fixed distance "b", as shown in FIG. 4. The first reversely bent portion, or radius 62, is also held to be less than the distance "b". This provides that the first contacting portion 58 and the leg 74 do not contact the outer 22 and inner 24 surfaces, respectively, at a position proximate the floor, resulting in an indeterminate amount of preload. Rather, the distance d, FIG. 3, from the bottom of the radius 62 to the corner 64 is greater than the distance "c", FIG. 4, from the floor 34 to the inner corner 46, therefore, when the terminal 50 is inserted within the cavity 20, the leg 74 always contacts the housing at the corner only.

In the preinserted terminal, the dimensions are held such that the sum of the distances "a" plus "t", the thickness of the stock, is greater than the distance "b". Thus, when the contact 50 is inserted within the cavity 20, the leg 74 rotates about radius 62, approximately 20°, until the portion 70 contacts the terminal portion 58. The remainder of the deflectio is taken up between the leg 74 and the first contacting portion 58, with the sum of the distance between the leg 74 and the second contacting portion 70 and the thickness "t" of the first contacting portion 58, acquiring the distance between the rear 22 and front 24 surfaces "b", and is a precisely held deflection which results in a precise amount of preload.

When the contact 50 is inserted into the cavity 20, the first and second leaves are centered in the cavity by beveled surfaces 28, 30 and 32. As the contact portions are mass inserted on carrier strips, it is important for beveled surfaces 28, 30 and 32 to center the contact portions. The straight portion 58 of the contact then lies adjacent to the outer cavity sidewall, the two surfaces in sliding relation with one another. Further insertion of the contact 50 causes portion 74 of contact 50 to interfere with the inner beveled surface 30, and continued insertion causes beveled surface 30 to act as a camming surface, projecting the second leaf portion 54 into the first leaf portion 52. The contacts 50 are held in place within the cavity by the lances 78 (FIG. 1) skiving into the sidewalls 26 upon insertion.

Also upon insertion of the contact in the cavity 20, the printed circuit board contact 60 will follow beveled surface 28, outer sidewall 22, sidewall beveled surface 42 and into the aperture 36. As the contacts are mass inserted on carrier strips, it is important for the cavity to be designed to allow entry of the contact portion 60 and centering of the contact portion 60 into the aperture.

The fit between the contact portion 60 and the aperture 36 is an interference fit, thereby sealing the interior part of the cavity from the printed circuit board side of the housing. As the connector 2 will eventually be soldered to a printed circuit board, the sealing feature of the aperture 36 will prevent solder and flux from wicking into the cavities 20.

Figure 5:
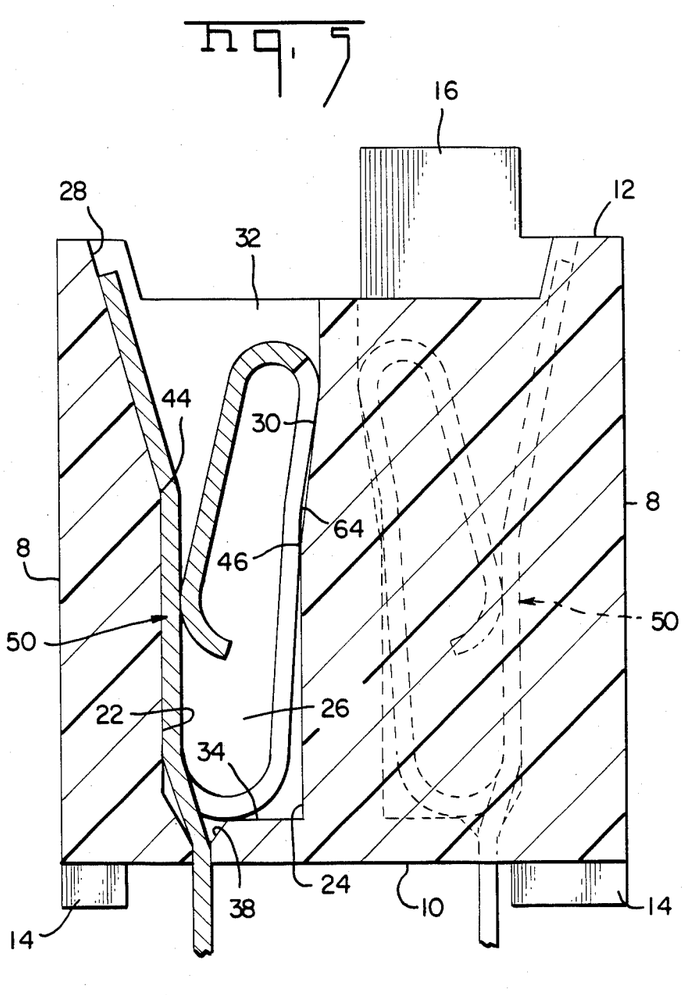
FIG. 5 is similar to FIG. 4 with the terminals inserted.

When the contact is fully inserted, as shown in FIG. 5, the contact lead-in section 56 lies adjacent to surface 28, straight portion 58 lies adjacent to outer cavity sidewall 22, the upper extremit of the leg 74 is in a contacting relation with the corner 46, and section 66 lies adjacent to inner beveled surface 30. As the surface 30 is beveled away from the cavity 20, the second radius 68 of contact 50 is larger than it could have been, had the sidewall 24 not contained the bevel 30, but rather, had continued as a straight wall. Furthermore, the lead-in angle between the terminal portions 56 and 76 is larger than it could have been had the inner surface 24 continued as a straight wall.

As installed, the lead-in section 56 and section 76 form an opening for a lead of a zig-zag inline package, and contact portion 70 is biased against portion 58 with a predetermined preload. As the stamped configuration of the contact 50 in its free state is accurately held geometrically and as the contact cavity 50 is also dimensionally controlled, the deformation of the contact 50, upon insertion into the cavity 20, creates a predictable preload between the first and second leaf portions 52, 54, respectively. As the insertion force is a function of the preload and the coefficient of friction between the package leads and the leaf sections of the contact, the insertion force of the package may also be consistently maintained.

The connector 2 may then be installed on the printed circuit board for receipt of a package. The connector 2 is placed on the printed circuit board 130 with the contact portions 60 extending through the printed circuit board through holes 134 and the contact portions 60 soldered to the individual traces 132, as shown in FIG. 7. When the package 100 is inserted in the connector 2, the package leads 110, 110' are aligned with the openings formed by the contact sections 56 and 76.

The insertion force required to insert the package 100 is designed to be less than 270 grams, as the package leads at 106, 106', 108, 108' will overstress at approximately 270 grams, To further insure that the package leads are not overstressed, standoff portions 16 are included above the package receiving face 12, such that the package sidewall 112 bottoms out on the standoff 16. As most integrated circuit packages are robotically assembled in a pick and place mode, the robot will sense the interference between the standoff 16 and the package 100. If the package 100 was inserted into the connector 2 without the standoffs, the ends of leads 110, 110' could bottom out against the contacts and be damaged before the robot sensed the resistance.

After the package 100 has been fully inserted, the instant design allows the continuity of the solder joint between the individual contacts 50 and the printed circuit board traces 132 to be tested. As the package receiving face is lowered to a recessed surface 18, probing instruments may be inserted under the package 100 and above the connector 2 for probing against the contacts 50.

The instant invention may also include an integral decoupling capacitor, as shown in FIG. 7. An integrated circuit package is decoupled from the power source for two purposes. First, when several integrated circuit packages demand power at the same time, the voltage in the power supply will drop because the power source cannot supply enough current to maintain the voltage. The capacitor will have enough electrical charge stored up to make the difference and keep the integrated circuit packages operating. Secondly, when integrated circuit packages go through the refresh cycle, the voltage will change so rapidly that it will cause a spike in the power supply, and the capacitor will filter out those spikes.

In the preferred embodiment of the instant invention, the capacitor 152 is formed integrally with the contact portions 150, the capacitor being reflow soldered onto the contact portions 150. The contact portions 150 has the same constituent components as the contact portions 50, rather, instead of being sheared off at the height of the package receiving face 12, the contacts 150 include capacitor mounting faces 154. Like the contacts 50, the contacts 150 can be formed in carrier strip form and robotically inserted.

A typical capacitor for decoupling an integrated circuit package is a 0.33 micro-farad, multi-layer ceramic capacitor manufactured by AVX, Inc. In order to decouple the integrated circuit package 100, one of the contact portions 150 is located at the power lead of the package and one contact portion 150 is located at the ground lead of the integrated circuit package.

With the decoupling capacitors mounted integrally with the contact portions, the instant invention further saves printed circuit board space, in that the capacitor does not have to be mounted directly on the printed circuit board, which, heretofore has been the practice.

Figure 9:
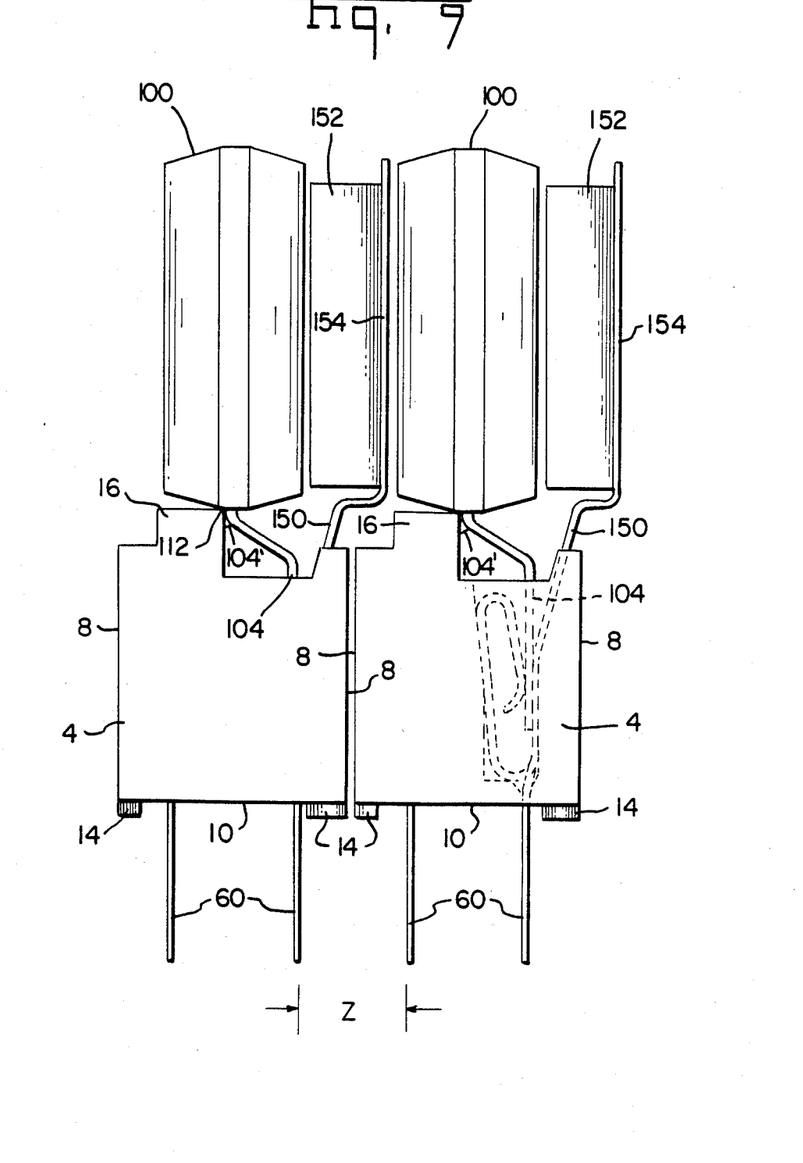
FIG. 9 is an end plan view showing the layout of two connectors with decoupling capacitors in side-by-side relation.

As shown in FIG. 8, the addition of the decoupling capacitor to the contact portions 150 does not increase the side-by-side stacking clearance of the package sockets. The center-to-center spacing of the adjacent contacts in adjacent connectors can be maintained at 0.100 inch, as shown in FIG. 9 as Z.

Figure 10:
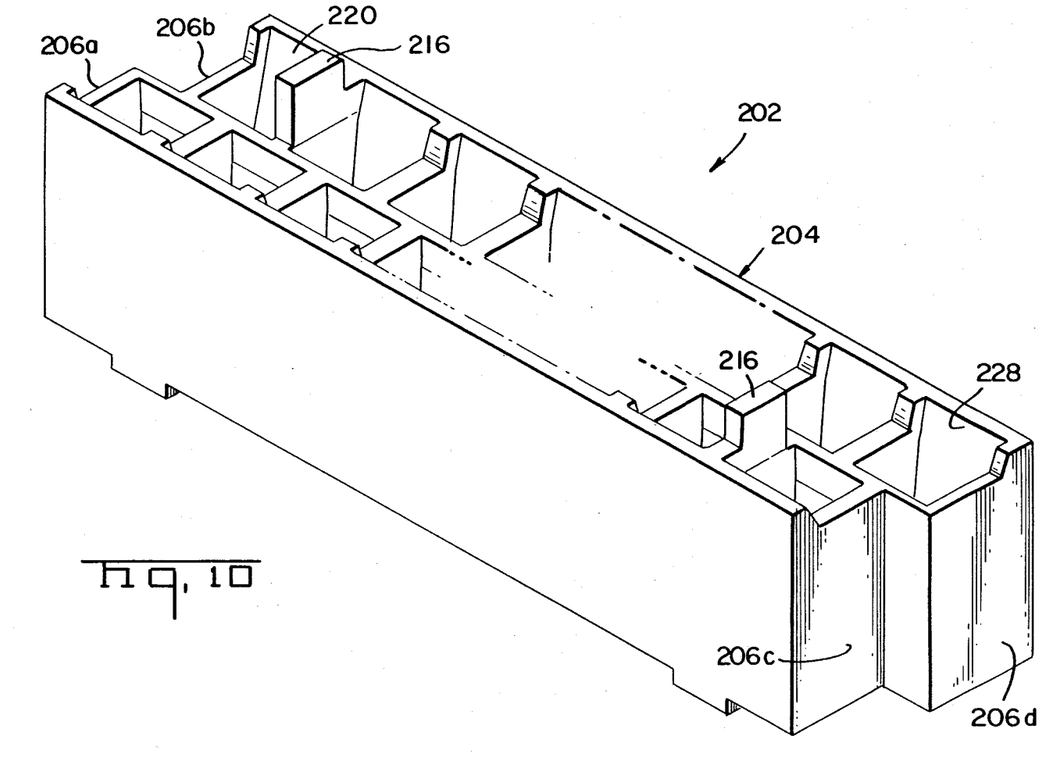
FIG. 10 is a perspective view of an embodiment which is end to end stackable.
Figure 11:
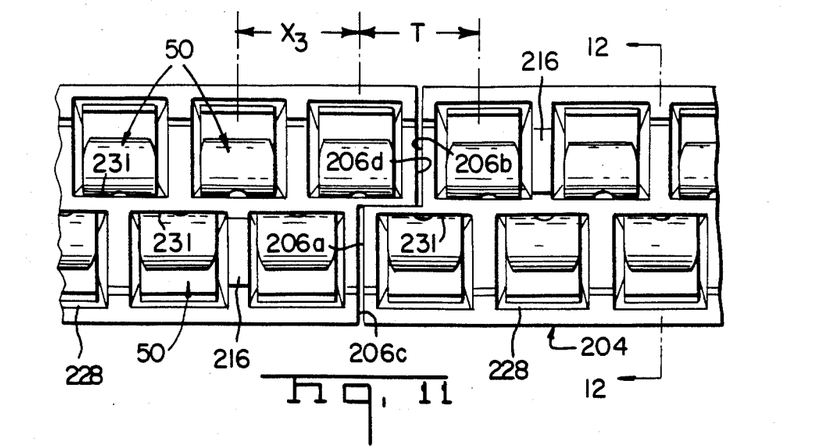
FIG. 11 is a top plan view showing the end-to-end stacking capability of another embodiment.

Although most applications require side-to-side stackability only, some applications do require end-to-end stacking capability. Another embodiment is shown in FIG. 10, which allows the sockets to be stacked end-to-end, maintaining the same center-to-center spacing between the adjacent contacts of adjacent sockets as the center-to-center spacing of adjacent contacts in the same socket. The housings 202 can be stacked end-to-end and still maintain the distance T between adjacent contacts of 0.100 inch, as shown in FIG. 11. The distance $X_3$ between adjacent contacts in the same socket is also 0.100 inch.

Referring now to FIG. 10, another embodiment employs a design similar to that of the embodiment shown in FIGS. 1–9 except for the design of the endwalls 206 and the location of the package standoffs 216. The embodiment shown in FIG. 10–12 includes endwalls 206a laterally offset form endwalls 206b, and endwalls 206c laterally offset form endwalls 206d. This lateral offset allows the endwalls 206a, 206b of the adjacent connector to abut endwalls 206c, 206d respectively, maintaining the same center-to-center distance between adjacent cavities of adjacent connectors as adjacent cavities in the same connector. To accommodate two adjacent sockets, as shown in FIG. 11, the central rib 5 is half the thickness of the remainder of the rib in the housing and the endwalls 206a, 206b, 206c, and 206d are half the thickness of the interior walls between adjacent cavities.

Figure 12:
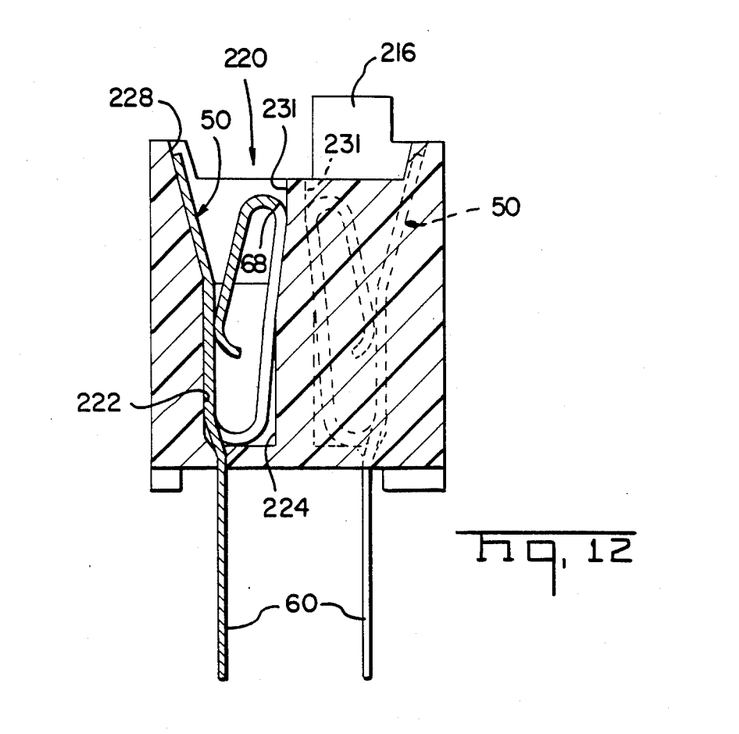
FIG. 12 is a cross section through a cavity of another embodiment.

In order to laterally offset the endwalls, the design of the cavities 220 must also be modified. As shown in FIG. 10, the package standoffs 216 are moves to the interior portion of the connector housing 204. Also, as shown in FIG. 12, the interior sidewall 230 must be modified by returning to a vertical portion 231 above the contact location. Otherwise, the sidewall portion 230 would become too thin at the upper edge for molding. The vertical section 231 does not affect the performance of the contact, as the vertical section begins at the tangency point of the contact second radius 68 and the interior sidewall 230.

It should be understood that the disclosure is exemplary and not meant to limit the scope of the claims. Particularly, although the decoupling capacitor integral with the contact leads is shown in configuration with a connector for a zig-zag inline package, it should be understood that other connectors could also incorporate such a design.

What is claimed:

1. An electrical socket having an insulative housing and a plurality of terminals having a predetermined preload between first and second contact portions, the housing having a plurality of cavities disposed in two parallel rows, each of said cavities defined by a front surface and a rear surface and side surfaces therebetween, the terminals comprising a terminal portion which lies adjacent to the rear surface defining the first contact portion and extends downwardly to a floor, the terminal portion being reversely bent at the floor to project upwardly defining a leg adjacent to the front surface, thereafter being reversely bent downwardly and radiused to lie inside of, and adjacent to, the first contacting portion to define the second contact portion, the terminals being formed from a flat blank of conductive material having a known thickness, the terminals being formed such that the legs and the second contact portions are angled away from the first contacting portions with the distance between the first and second contact portions consistently held in a noncontacting relationship with a gap therebetween, before the terminals are inserted into the housings each of the terminals being formed such that the outside distance between the leg and the second contact portions is consistently held at a first distance, the insulative housing being molded such that the distance between the front and rear surface of each cavity is consistently held to a second distance which is less than the sum of the first distance and the thickness of the material, whereby when the terminals are inserted into the housing, the leg and second contact portion of each terminal rotate about the first reversely bent portion towards the first contact portion until the second contact portion contacts the first contacting portion, further insertion causing the leg to continue to rotate about the first reversely bent portin and the second contact portion to rotate about the second reversely bent portion, such that the first contact portion lies adjacent to the rear surface and the leg lies adjacent to the front surface, the outside distance between the leg and the first contact portion assuming substantially the distance between the front and rear surfaces.

2. The socket of claim 1 wherein the radius of curvature of the first reversely bent portion is larger than the radius of curvature of the second reversely bent portion.

3. The socket of claim 1 wherein the width of the first reversely bent portion is smaller than the distance between the front and rear surface.

4. The socket of claim 3 wherein the front surface includes a beveled surface at an upper end thereof defining a corner in an intermediate portion of the front surface, the terminal and cavity being profiled such that the leg is in a contacting relationship with the corner.

5. The socket of claim 4 wherein the leg above the corner is bent to lie adjacent to the beveled surface.

6. The socket of claim 5 wherein the bent in the leg is above the corner.

7. A method of manufacturing an electrical socket having an insulative housing and a plurality of terminals such that the terminals have a predetermined preload between first and second contact portions, the housing having a plurality of cavities disposed in two parallel rows, ech cavity defined by a front surface and a rear surface and side surfaces therebetween, the terminals comprising a terminal portion which lies adjacent to the rear surface defining the first contact portion and extends downwardly to a floor, the terminal portion being reversely bent at the floor to project upwardly defining a leg adjacent to the front surface, thereafter being reversely bent downwardly and radiused to lie inside of, and adjacent to, the first contacting portion to define the second contact portion, the method including the steps of:

stamping the terminals from a flat blank of conductive material having a known thickness;

forming the terminals such that the legs and the second contact portions are angled away from the first contacting portions with the distance between the first and second contact portions consistently held in a noncontacting relationship with a gap therebetween;

forming the terminals such that the outside distances between the legs and the second contact portions are consistently held at a first distance;

molding the insulative housing such that the distance between the front and rear surface of each cavity is consistently held to a second distance which is less than the sum of the first distance and the thickness of the material; and inserting the terminals into the housings, the leg and second contact portion of each terminal rotating about the first reversely bent portion towards the first contacting portion until the second contacting portion contacts the first contacting portion, further insertion causing the leg to continue to rotate about the first reversely bent portion and the second contact portion to rotate about the second reversely bent portion, such that the first contacting portion lies adjacent to the rear surface and the leg lies adjacent to the front surface, the outside distance between the leg and the first contacting portion assuming substantially the distance between the front and rear surfaces.

8. The method of claim 7 wherein the first reversely bent portion is rotated through an angle of approximately twenty degrees during the insertion of the terminal.

9. An electrical socket for interconnecting thereto a semiconductor device of the type comprising a package body including a plurality of package leads extending downwardly therefrom, the socket comprising:

an insulative housing comprising two parallel rows of cavities separated by a central support rib, each cavity including a rear surface, side surfaces, and a forward surface as part of the central support rib, the rear surface including an outwardly directed beveled surface and the forward surface including an inwardly directed beveled surface extending towards the axial centerline of the central support rib, the intersection of the forward surface and the beveled surface defining a corner; and a plurality of stamped and formed terminals having a first lead-in portion located adjacent to the outer beveled surface in transition with a portion extending downwardly which defines a first contacting portion, the terminal thereafter including a first reversely bent portion having an outer diameter which is less than the distance between the forward and rear surfaces, the first reversely bent portion extending a leg portion upwardly, the leg being in a contacting relationship with the corner, the leg having a second reversely bent portion which projects a diagonal portion downwardly towards the first contacting portion and thereafter being radiused to contact the first contacting portion.

10. The socket of claim 9 wherein the leg portion above the corner is bent to lie adjacent to the inner beveled surface.

* * * * *

UNITED STATES PATENT AND TRADEMARK OFFICE
CERTIFICATE OF CORRECTION

PATENT NO. : 4,726,777

DATED : February 23, 1988

INVENTOR(S) : Timothy B. Billman; Joseph R. Goodman; Gary R. Marpoe, Jr.

It is certified that error appears in the above-identified patent and that said Letters Patent is hereby corrected as shown below:

In column 8, line 64, claim 1, change "housings" to read ---housing---.

In column 8, line 66, claim 1, change "portions" to read ---portion---.

In column 9, line 8, claim 1, change "contacting" to read ---contact---.

In column 9, line 32, claim 6, change "bent" to read ---bend---.

Signed and Sealed this

Sixteenth Day of August, 1988

Attest:

DONALD J. QUIGG

*Attesting Officer*   *Commissioner of Patents and Trademarks*